United States Patent
Lee (10) Patent No.: US 11,048,278 B2
(45) Date of Patent: Jun. 29, 2021

(54) METHOD AND SYSTEM FOR CONTROLLING CLUSTER OF SOLAR TRACKERS

(71) Applicants: SUNGCHANG CO., LTD., Chungcheongbuk-Do (KR); SUNGCHANG ENERGY LAB, Chungcheongbuk-do (KR)

(72) Inventor: Jae Jin Lee, Chungcheongbuk-do (KR)

(73) Assignees: SUNGCHANG CO., LTD., Chungcheongbuk-Do (KR); SUNGCHANG ENERGY LAB, Chungcheongbuk-Do (KR)

( * ) Notice: Subject to any disclaimer, the term of this patent is extended or adjusted under 35 U.S.C. 154(b) by 437 days.

(21) Appl. No.: 16/095,773

(22) PCT Filed: Aug. 14, 2017

(86) PCT No.: PCT/KR2017/008824
§ 371 (c)(1),
(2) Date: Oct. 23, 2018

(87) PCT Pub. No.: WO2019/027079
PCT Pub. Date: Feb. 7, 2019

(65) Prior Publication Data
US 2021/0011496 A1   Jan. 14, 2021

(30) Foreign Application Priority Data
Aug. 4, 2017   (KR) .................. 10-2017-0099212

(51) Int. Cl.
G05D 3/10    (2006.01)
H02S 20/32   (2014.01)
(Continued)

(52) U.S. Cl.
CPC ............ *G05D 3/105* (2013.01); *G01S 3/7861* (2013.01); *H02S 20/32* (2014.12); *H02S 50/00* (2013.01)

(58) Field of Classification Search
CPC ......... G05D 3/105; H02S 20/32; H02S 50/00; G01S 3/7861; Y02E 10/47; Y02E 10/50;
(Continued)

(56) References Cited

U.S. PATENT DOCUMENTS 8,076,625 B2 * 12/2011 McDonald .............. F24S 50/20
                                                       250/203.4
8,642,936 B2 *  2/2014 Pan ......................... F24S 50/20
                                                       250/203.4

FOREIGN PATENT DOCUMENTS

KR         10-0917404 B1     9/2009
KR    10-2011-0029730 A      3/2011
(Continued)

*Primary Examiner* — Seung C Sohn
(74) *Attorney, Agent, or Firm* — Harness, Dickey & Pierce, P.L.C.

(57) ABSTRACT

Disclosed is a method of controlling a cluster of solar trackers in which a plurality of solar trackers exist as a cluster shape. The method includes detecting, by each of the cluster of solar trackers, one or more of power generation amount information, altitude information, and azimuth information thereof and transmitting the detected power generation amount information, altitude information, or azimuth information to a server, calculating, by the server, average power generation amount information, average altitude information, or average azimuth information using the power generation amount information, altitude information, or azimuth information of each of the cluster of solar trackers, and determining whether the cluster of solar trackers is normal by comparing the calculated average power generation amount information, average altitude information, or average azimuth information with the power gen- (Continued)

eration amount information, altitude information, or azimuth information detected by each of the cluster of solar trackers.

8 Claims, 5 Drawing Sheets

(51) Int. Cl.
*G01S 3/786* (2006.01)
*H02S 50/00* (2014.01)

(58) Field of Classification Search
CPC ......... F24S 50/20; G01R 22/06; G01D 21/02; G01W 1/02
See application file for complete search history.

(56) References Cited

FOREIGN PATENT DOCUMENTS

| | | |
|---|---|---|
| KR | 10-2013-0110981 A | 10/2013 |
| KR | 10-2016-0069374 A | 6/2016 |

* cited by examiner

FIG. 5

METHOD AND SYSTEM FOR CONTROLLING CLUSTER OF SOLAR TRACKERS

CROSS-REFERENCE TO RELATED APPLICATIONS

This application is a national phase application of PCT Application No. PCT/KR2017/008824, filed on Aug. 14, 2017, which claims the benefit and priority to Korean Patent Application No. 10-2017-0099212, filed on Aug. 4, 2017. The entire disclosures of the applications identified in this paragraph are incorporated herein by references.

TECHNICAL FIELD

The present invention relates to a solar tracker, which adjusts a height of a solar condensing plate, on which a plurality of solar cells are installed, and horizontally rotates the solar condensing plate to allow the solar condensing plate to face the sun, and more particularly, to a method and a system for controlling a cluster of solar trackers in which a plurality of solar trackers exist as a cluster shape.

BACKGROUND

Recently, due to a lack of energy and environmental pollution of the earth, developments of eco-friendly alternative energy have been sought after. As one of them, rapid advance has been made in development and application of solar energy. A variety of apparatuses for using solar energy as one of such alternative energies, that is, solar (light) cell, solar heating apparatus, and the like have been developed.

The solar energy is not only a source of energy necessary for our daily lives but also a driving force of a variety of meteorological phenomena or sea currents. In addition, as examples of using solar energy, a solar water heater, a solar-heated house, a solar furnace, a solar power generator, and the like are present in addition to solar cells.

Solar energy is a clean, renewable, and unlimited energy source. A solar light technology is a system technology of converting solar energy. Since there is no mechanical or chemical action during an energy conversion process, a system has a simple structure, which hardly requires maintenance and repair, has a long life of 20 to 30 years, and is safe and eco-friendly. Also, a variety of power generation scales from a house to a large-scaled power generation facility may be provided.

In such a developing process, a solar tracker, which allows a solar energy collecting apparatus to track a direction of the sun to efficiently use solar energy, has been provided.

However, in the case of a cluster of solar trackers in which a plurality of solar trackers exist as a cluster shape, uniform control is not performed. Particularly, when adequate solar tracking is delayed for a considerable amount of time, it becomes more difficult to uniformly control the cluster of solar trackers.

SUMMARY

Technical Problem

The present invention is directed to providing a method and a system for controlling a cluster of solar trackers, in which a plurality of solar trackers exist as a cluster shape, to efficiently control operations of the cluster of solar trackers.

Technical Solution

One aspect of the present invention provides a method of controlling a cluster of solar trackers in which a plurality of solar trackers exist as a cluster shape. The method includes detecting, by each of the cluster of solar trackers, one or more of power generation amount information, altitude information, and azimuth information thereof and transmitting the detected power generation amount information, altitude information, or azimuth information to a server, calculating, by the server, average power generation amount information, average altitude information, or average azimuth information using the power generation amount information, altitude information, or azimuth information of each of the cluster of solar trackers, and determining whether the cluster of solar trackers is normal by comparing the calculated average power generation amount information, average altitude information, or average azimuth information with the power generation amount information, altitude information, or azimuth information detected by each of the cluster of solar trackers.

The method may further include comparing, by the server, insolation information of a place where the cluster of solar trackers is located with an insulation reference value and transmitting, by the server, a first request signal for providing the power generation amount information, altitude information, or azimuth information to each of the cluster of solar trackers when the insolation information of the place where the cluster of solar trackers is located is at or above the insolation reference value. Here, in response to the first request signal, the cluster of solar trackers may detect and transmit the power generation amount information, altitude information, or azimuth information to the server.

The method may further include transmitting, by the server, a second request signal for providing global positioning system (GPS) information with respect to each of the cluster of solar trackers to each of the cluster of solar trackers when the insolation information of the place where the cluster of solar trackers is located is less than the insolation reference value, detecting, by each of the cluster of solar trackers, the GPS information thereof and transmitting the detected GPS information to the server, and controlling, by the server, an altitude and an azimuth of each of the cluster of solar trackers by using the GPS information of each of the cluster of solar trackers.

The method may further include displaying, by the server, state information of the cluster of solar trackers on a display screen and controlling, by the server, an altitude or an azimuth of each of the cluster of solar trackers according to the state information of the cluster of solar trackers.

Another aspect of the present invention provides a system for controlling a cluster of solar trackers. The system includes a cluster of solar trackers which detects one or more of power generation amount information, altitude information, and azimuth information thereof and a server which determines whether the cluster of solar trackers is normal by using the power generation amount information, altitude information, or azimuth information provided by the cluster of solar trackers. Here, the server determines whether the cluster of solar trackers is normal by calculating average power generation amount information, average altitude information, or average azimuth information by using the power generation amount information, altitude information, or azimuth information of each of the cluster of solar trackers and comparing the calculated average power generation amount information, average altitude information, or average azimuth information with the power generation amount information, altitude information, or azimuth information detected by the cluster of solar trackers.

The system may further include an illuminance sensor which detects insolation information of a place where the cluster of solar trackers is located. Here, when the illuminance sensor transmits the insolation information to the server, the server may determine whether the received insolation information is at or above an insolation reference value and may transmit a first request signal for providing the power generation amount information, altitude information, or azimuth information to each of the cluster of solar trackers when the insolation information of the place where the cluster of solar trackers is located is at or above the insolation reference value.

When the insolation information of the place where the cluster of solar trackers is located is less than the insolation reference value, the server may transmit a second request signal for providing GPS information with respect to each of the cluster of solar trackers to each of the cluster of solar trackers. Each of the cluster of solar trackers may detect the GPS information thereof and may transmit the detected GPS information to the server. Also, the server may control an altitude and an azimuth of each of the cluster of solar trackers by using the GPS information of each of the cluster of solar trackers.

The server may display state information of the cluster of solar trackers on a display screen.

Advantageous Effects

According to the present invention, each of a cluster of solar trackers detects and transmits one or more of power generation amount information, altitude information, and azimuth information thereof to a server and the server calculates average power generation amount information, average altitude information, and average azimuth information thereof and determines whether the cluster of solar trackers is normal such that power generation performance of the cluster of solar trackers which exists as a cluster shape may be increased and a plurality of such solar trackers may be easily and efficiently controlled.

DETAILED DESCRIPTION

Hereinafter, exemplary embodiments of the present invention will be described in detail with reference to the attached drawings.

Figure 1:
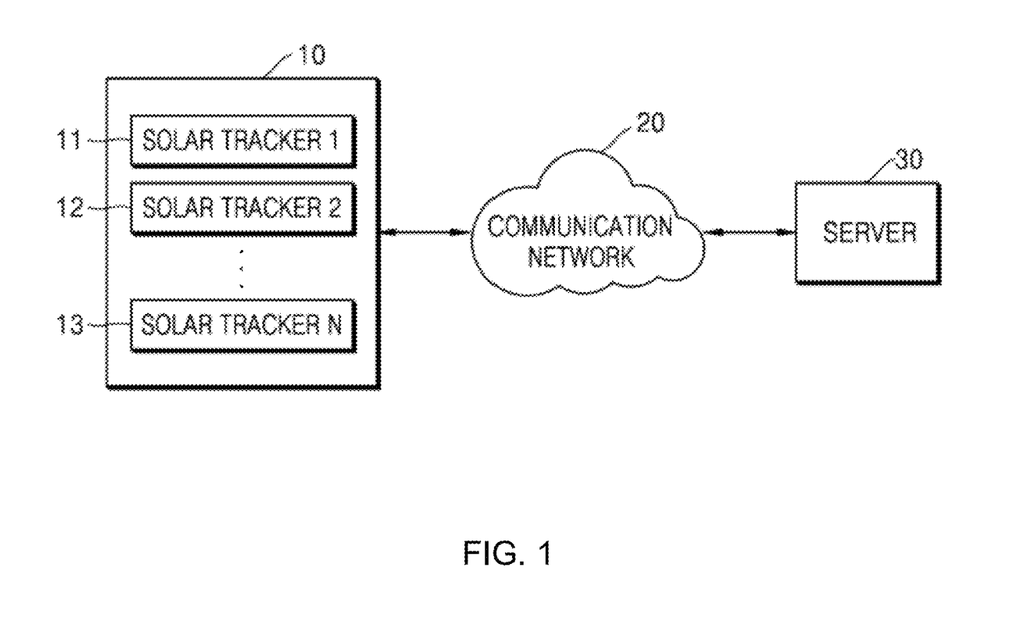
FIG. 1 is a block diagram illustrating an example of a system for controlling a cluster of solar trackers according to one embodiment of the present invention.

FIG. 1 is a block diagram illustrating an example of a system for controlling a cluster of solar trackers according to one embodiment of the present invention.

Referring to FIG. 1, the system for controlling the cluster of solar trackers includes a cluster of solar trackers 1 to N 10, a communication network 20, and a server 30.

The cluster of solar trackers 10 are a plurality of solar trackers which exist as a cluster. In FIG. 1, a solar tracker 1 11, a solar tracker 2 12, or a solar tracker N 13 is shown but is merely an example. The solar trackers 10 may detect and transmit power generation amount information, altitude information, azimuth information, global positioning system (GPS) information, insolation information, wind speed information, or the like thereof to the server 30. To this end, the cluster of solar trackers 10 are each connected to the server 30 and the communication network 20.

The communication network 20 includes a wired communication network or a wireless communication network for transmitting and receiving data between the cluster of solar trackers 10 and the server 30. The wired communication network may be exemplified as wired Internet. The wireless communication network may be exemplified as wireless Internet such as wireless fidelity (WiFi), potable Internet such as wireless broadband Internet (WiBro), world interoperability for microwave access (WiMax), a 3G mobile communication network, a 4G mobile communication network, such as a long term evolution (LTE) network and an LTE-advanced network, a 5G mobile communication network, and the like.

The server 30 is connected to the cluster of solar trackers 10 through the above-described communication network 20 and controls operations of the cluster of solar trackers 10. The server 30 may determine whether the cluster of solar trackers 10 normally operate, by using the power generation amount information, the altitude information, or the azimuth information, which are provided by each of the cluster of trackers 10. Also, the server 30 may control operations of the cluster of solar trackers 10 according to the GPS information and the wind speed information provided by the cluster of solar trackers 10 or meteorological information of the Meteorological Agency.

Figure 2:
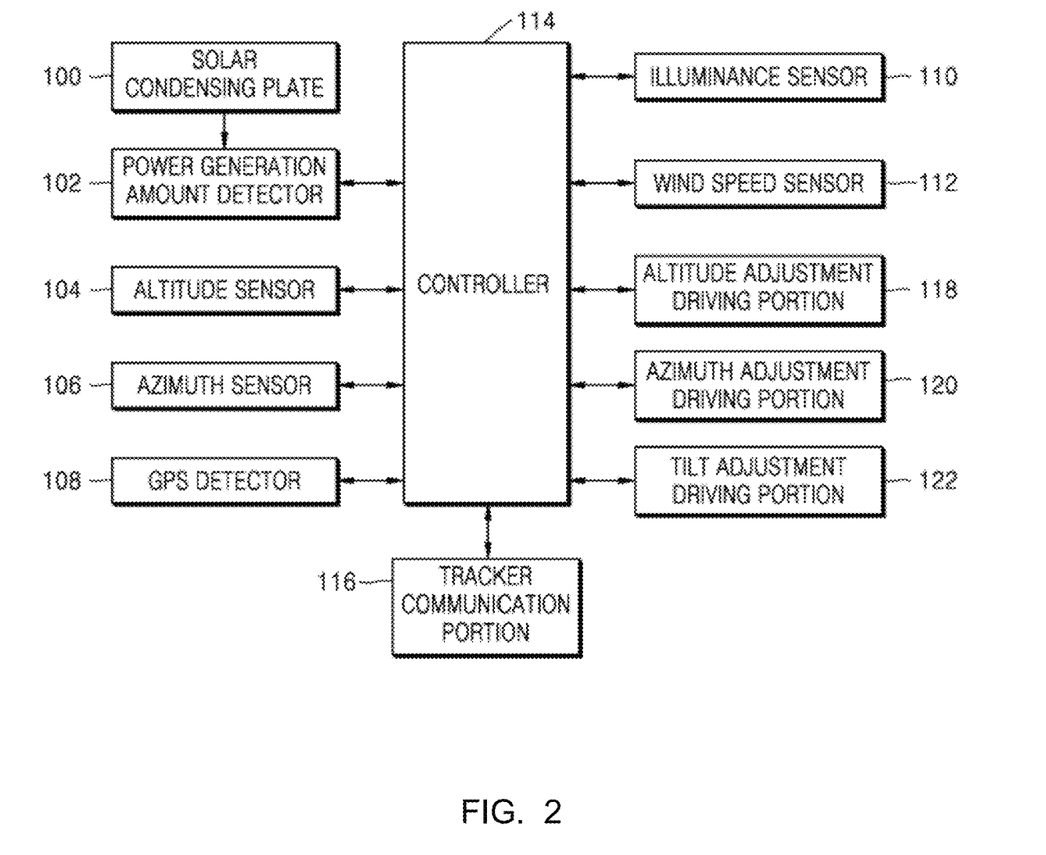
FIG. 2 is a block diagram illustrating an example of any one of the solar trackers included in the cluster shown in FIG. 1.

FIG. 2 is a block diagram illustrating the solar tracker 11 which is any one of the cluster of solar trackers 10 according to one embodiment of the present invention.

Referring to FIG. 2, the solar tracker 11 may include a solar condensing plate 100, a power generation amount detector 102, an altitude sensor 104, an azimuth sensor 106, a GPS detector 108, an illuminance sensor 110, a wind speed sensor 112, a controller 114, a tracker communication portion 116, an altitude adjustment driving portion 118, an azimuth adjustment driving portion 120, a tilt adjustment driving portion 122, and the like. Since structures of other solar trackers 12 and 13 shown in FIG. 1 have the same component as those of the solar tracker 11 shown in FIG. 2, hereinafter, a description of components of each of the cluster of solar trackers 10 will be replaced by a description of the solar tracker 11.

The solar condensing plate 100 is a module formed by combing a plurality of solar cell panels. A structure and a shape of the solar condensing plate 100 may be variously designed and changed by those skilled in the art.

The power generation amount detector 102 detects information on a power generation amount with respect to the solar tracker 11. The power generation amount detector 102 may detect information on a power generation amount generated by sunlight condensed by the solar condensing plate 100 for each time, day, month, or year. The power generation amount detector 102 may be exemplified as an inverter (generator) connected to the solar condensing plate 100. The power generation amount detector 102 transmits detected power generation amount information to the controller 114.

The altitude sensor 104 detects altitude information with respect to the solar tracker 11. The altitude sensor 104 may be exemplified as an atmospheric pressure sensor which may measure atmospheric pressure corresponding to an altitude at which the solar tracker 11 is located so as to detect an altitude. The altitude sensor 104 transmits detected altitude information to the controller 114.

The azimuth sensor 106 detects azimuth information with respect to the solar tracker 11. The azimuth sensor may be exemplified as a geomagnetic sensor. The geomagnetic sensor is a sensor which senses a flow of a magnetic field generated from the earth so as to an azimuth. The azimuth sensor 106 may detect azimuth information of the solar tracker 11 according to a direction and an oscillation period of a geomagnetic field. The azimuth sensor 106 transmits detected azimuth information to the controller 114.

The GPS detector 108 detects GPS information with respect to the solar tracker 11. To this end, the GPS detector 108 may include a GPS reception module which receives a GPS signal from an artificial satellite. The GPS information detected by the GPS detector 108 may include altitude information or azimuth information of the solar tracker 11. The GPS detector 108 transmits detected GPS information to the controller 114.

The illuminance sensor 110 detects insolation information at a place where the cluster of solar trackers 10 is located. The illuminance sensor 110 may transmit detected insolation information to the controller 114. The illuminance sensor 110 may be a photoconductive sensor. The photoconductive sensor is a sensor in which internal resistance changes according to an amount of light such that the internal resistance decreases when the amount of light increases and the internal resistance increases when the amount of light decreases. As the photoconductive sensor, there are a CdS sensor, a PbS sensor, and the like. Meanwhile, although the illuminance sensor 110 is exemplified as a component of the solar tracker 11 in the present invention, the illuminance sensor 110 is not necessarily provided at the cluster of solar trackers 10 and may exist as an independent module form. Also, one or a plurality of such illuminance sensors 110 may be present at a position where the cluster of solar trackers 10 is located.

The wind speed sensor 112 detects wind speed information at a place where the cluster of solar trackers 10 is located. The wind speed sensor 112 may include a rotating anemometer, a wind pressure type anemometer, an ultrasonic anemometer, and the like according to a method of measuring a wind speed. The wind speed sensor 112 may transmit detected wind speed information to the controller 114. Meanwhile, although the wind speed sensor 112 is exemplified as a component of the solar tracker 11, the wind speed sensor 112 is not necessarily provided at the cluster of solar trackers 10 and may exist as an independent module form. Also, one or a plurality of such wind speed sensors 112 may be present at a position where the cluster of solar trackers 10 is located.

The controller 114 controls operations of the power generation amount detector 102, the altitude sensor 104, the azimuth sensor 106, the GPS detector 108, the illuminance sensor 110, the wind speed sensor 112, the tracker communication portion 116, the altitude adjustment driving portion 118, the azimuth adjustment driving portion 120, and the tilt adjustment driving portion 122. For example, the controller 114 may control the tracker communication portion 116 to transmit detected power generation amount information, altitude information, azimuth information, GPS information, insolation information, wind speed information, and the like to the server 30.

The tracker communication portion 116 transmits the power generation amount information, altitude information, azimuth information, GPS information, insolation information, wind speed information, and the like, which are detected by the solar tracker 11 under the control of the controller 114, to the server 30. To this end, the tracker communication portion 116 is connected to the server 30 through a wired communication network or a wireless communication network and may include a wired communication module or a wireless communication module which supports the wired communication network or the wireless communication network.

Also, the tracker communication portion 116 may receive a signal for controlling the altitude adjustment driving portion 118, the azimuth adjustment driving portion 120, or the tilt adjustment driving portion 122 from the server 30 and may transmit the received control signal to the controller 114. The controller 114 may output a driving control signal for operating the altitude adjustment driving portion 118, the azimuth adjustment driving portion 120, or the tilt adjustment driving portion 122 according to the received control signal.

The altitude adjustment driving portion 118 may adjust an altitude of the solar condensing plate 100 according to an altitude adjustment driving value corresponding to the driving control signal of the controller 114. Power for driving the altitude adjustment driving portion 118 may be supplied by a solar cell of the solar condensing plate 100.

The azimuth adjustment driving portion 120 may adjust an azimuth of the solar condensing plate 100 according to an azimuth adjustment driving value corresponding to the driving control signal of the controller 114. Power for driving the azimuth adjustment driving portion 120 may also be supplied by the solar cell of the solar condensing plate 100.

The tilt adjustment driving portion 122 may adjust a tilt of the solar condensing plate 100 according to a tilt adjustment driving value corresponding to the driving control signal of the controller 114. Power for driving the tilt adjustment driving portion 122 may be also supplied by the solar cell of the solar condensing plate 100.

Figure 3:
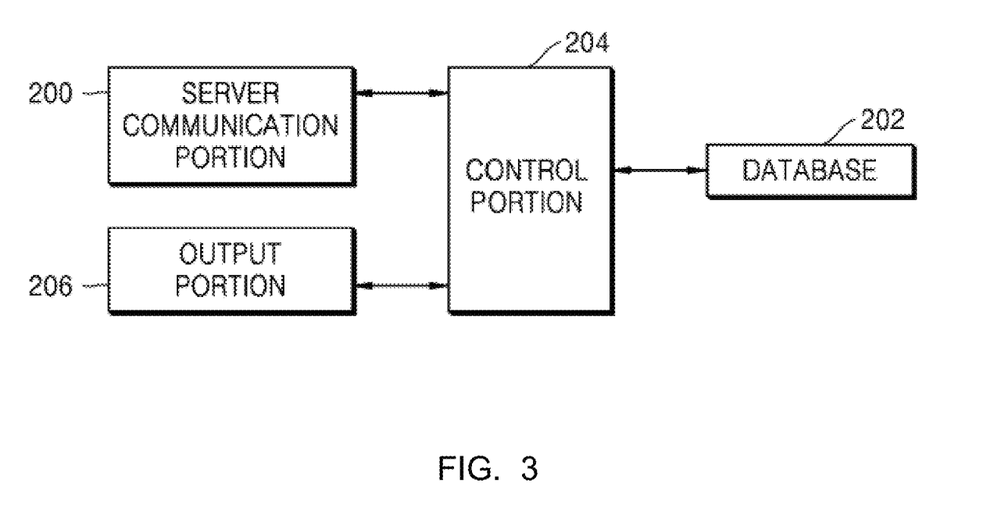
FIG. 3 is a block diagram illustrating an example of a server shown in FIG. 1.

FIG. 3 is a block diagram illustrating an example of a server shown in FIG. 1.

Referring to FIG. 3, the server 30 may include a server communication portion 200, a database 202, a control portion 204, and an output portion 206.

The server communication portion 200 is connected to each of the cluster of solar trackers 10 through a wired communication network or a wireless communication network. The server communication portion 200 may support wired communication protocols including a local area network (LAN), a wide area network (WAN), or wired Internet for connection to the cluster of solar trackers 10 through the wired communication network. Also, the server communication portion 200 may support wireless communication protocols including wireless Internet, portable Internet, a 3G mobile communication network, a 4G mobile communication network, or a 5G mobile communication network for connection to the cluster of solar trackers 10 through the wireless communication network.

The server communication portion 200 may transmit a first request signal for providing power generation amount information, altitude information, or azimuth information to each of the cluster of solar trackers 10. Also, the server communication portion 200 may receive power generation amount information, altitude information, azimuth information, GPS information, and the like from each of the cluster of solar trackers 10. Also, the server communication portion 200 may receive insolation information or wind speed information from the illuminance sensor or the wind speed sensor which exists at a place where the cluster of solar trackers 10 is located. Also, the server communication portion 200 may receive meteorological information (for example, snow cover amount information, weather information, and the like) from a server of the Meteorological Agency.

The database 202 stores network address information corresponding to each of the cluster of solar trackers 10. Also, the database 202 may store the power generation amount information, the altitude information, the azimuth information, and the GPS information corresponding to each of the cluster of solar trackers 10 which are received by the server communication portion 200. Also, the database 202 may store insolation information, wind speed information, meteorological information of the Meteorological Agency, or the like of a place where the cluster of solar trackers 10 is located.

The control portion 204 determines whether the insolation information provided from the illuminance sensor 110 at the place where the cluster of solar trackers 10 is located is at or above a first insolation reference value. To this end, the control portion 204 requests the insolation information from the illuminance sensor 110 which is present at the place where the cluster of solar trackers 10 is located and receives and compares the insolation information provided from the illuminance sensor 110 with the first insolation reference value. The first insolation reference value means insolation which is a reference of a fine weather in a day mode when a day is divided into the day mode and a night mode. Accordingly, it is defined as a fine weather when the insolation information is at or above the first insolation reference value and is defined as a cloudy weather when the insolation information is less than the first insolation reference value.

The control portion 204 stores information on the first insolation reference value in an internal memory (not shown). The memory may include a main memory and an auxiliary memory. The main memory corresponds to a volatile memory in which data necessary for determining whether insolation is a reference value is temporarily stored, and the auxiliary memory corresponds to a nonvolatile memory in which application program codes and the like for performing an operation of the control portion 204 are stored.

When the insolation information of the place where the cluster of solar trackers 10 is located is at or above the first insolation reference value, the control portion 204 controls so as to transmit the first request signal for providing the power generation amount information, the altitude information, or the azimuth information to each of the cluster of solar trackers 10. Accordingly, the above-described server communication portion 200 transmits the first request to each of the cluster of solar trackers 10. When the insolation information of the place where the cluster of solar trackers 10 is located is at or above the first insolation reference value, it corresponds to a fine weather in which the power generation amount information, the altitude information, and the azimuth information detected by the cluster of solar trackers 10 are relatively accurate. Accordingly, the control portion 204 controls so as to receive pieces of information detected by the cluster of solar trackers 10 only in a fine weather.

Afterwards, the control portion 204 calculates average power generation amount information, average altitude information, or average azimuth information using power generation amount information, altitude information, or azimuth information corresponding to each of the cluster of solar trackers 10 which is received by the server communication portion 200. To this end, the control portion 204 may be configured as a logic circuit including at least one processing core and may include a memory control logic.

The control portion 204 may determine whether the cluster of solar trackers 10 is normal by comparing the calculated average power generation amount information, average altitude information, average altitude information, or average azimuth information with the power generation amount information, altitude information, or azimuth information of each of the cluster of solar trackers 10. For example, the control portion 204 may compare the power generation amount information detected by each of the cluster of solar trackers 10 with the calculated average power generation amount information and may determine, according to a result of comparison, that one of the cluster of solar trackers which deviates from a threshold range of the average power generation amount information does not normally operate. That is, when power generation amount information lower than a power generation amount threshold range in comparison to average power generation amount information is detected in a weather in which insolation is at or above a reference value, it may be determined that a solar tracker having the power generation amount information does not normally operate in comparison to other solar trackers. An abnormality of the solar tracker may be a damage of the solar condensing plate, a failure of an inverter which converts light condensed by the solar condensing plate into electrical energy, or the like. Also, the control portion 204 may compare the altitude information detected by each of the cluster of solar trackers 10 with the calculated average altitude information and may determine, according to a result of comparison, that one of the cluster of solar trackers which deviates from a threshold range in comparison to the average altitude information does not normally operate. That is, when altitude information which deviates from an altitude threshold range in comparison to average altitude information is detected in a weather in which insolation is at or above a reference value, it may be determined that a solar tracker having the altitude information does not normally operate in comparison to other solar trackers. Also, the control portion 204 may compare the azimuth information detected by each of the cluster of solar trackers 10 with the calculated average azimuth information and may determine, according to a result of comparison, that one of the cluster of solar trackers which deviates from a threshold range in comparison to the average azimuth information does not normally operate. That is, when azimuth information which deviates from an azimuth threshold range in comparison to average azimuth information is detected in a weather in which insolation is at or above a reference value, it may be determined that a solar tracker having the azimuth information does not normally operate in comparison to other solar trackers.

The control portion 204 may control the output portion 206 to display state information of the cluster of solar trackers 10. For example, the control portion 204 may calculate power generation amount efficiency of each of the cluster of solar trackers 10 by comparing power generation amount information of each of the cluster of solar trackers 10 with maximum power generation amount information of the cluster of solar trackers 10. Accordingly, the control portion 204 may control the output portion 206 to display efficiencies of the cluster of solar trackers by using different colors according to the calculated power generation amount efficiencies. Also, the control portion 204 may control the output portion 206 to display state information of the cluster of solar trackers 10 with respect to whether the cluster of solar trackers 10 is normal, by using a differentiated color.

When the insolation information of the place where the cluster of solar trackers 10 is located is less than the first insolation reference value, the control portion 204 controls such that a second request signal for providing GPS information with respect to each of the cluster of solar trackers 10 is transmitted to each of the cluster of solar trackers 10. When the insolation information of the place where the cluster of solar trackers 10 is located is less than the first insolation reference value, it corresponds to a cloudy weather in which the power generation amount information, the altitude information, and the azimuth information detected by the cluster of solar trackers 10 may not be accurate. Accordingly, in the cloudy weather, the control portion 204 requests GPS information, which is relatively accurate regardless of a weather, among pieces of information detected by the cluster of solar trackers 10. Each of the cluster of solar trackers 10 detects GPS information according to the second request signal transmitted from the server 30 and transmits detected GPS information to the server 30. Afterwards, the control portion 204 may control an altitude and an azimuth of each of the cluster of solar trackers 10 by using the GPS information transmitted from each of the cluster of solar trackers 10. When the control portion 204 controls the server communication portion 200 to transmit a control signal for adjusting an altitude or azimuth to the cluster of solar trackers 10, the server communication portion 200 transmits the control signal to each of the cluster of solar trackers 10. Accordingly, the cluster of solar trackers 10 which receives the control signal may adjust the altitude or azimuth by driving the altitude adjustment driving portion 118 or the azimuth adjustment driving portion 120 according to the control signal.

When meteorological information (for example, snow cover amount information) of the place where the cluster of solar trackers 10 is located is received from the server of the Meteorological Agency, the control portion 204 determines whether the received snow cover amount information exceeds a snow cover threshold value. When the snow cover amount information exceeds the snow cover amount threshold value, the control portion 204 controls such that a first tilt control signal of the solar condensing plate 100 with respect to the cluster of solar trackers 10 is transmitted to the cluster of solar trackers 10. Accordingly, when the server communication portion 200 transmits the first tilt control signal, the cluster of solar trackers 10, which receives the first tilt control signal, may adjust a tilt of the solar condensing plate 100 by driving the tilt adjustment driving portion 122 according to the first tilt control signal. When the snow cover amount information exceeds the snow cover amount threshold value, the cluster of solar trackers 10 may be damaged by a load of snow piled up on the solar condensing plate 100. To prevent this, when the control portion 204 transmits the first tilt control signal for allowing the tilt of the solar condensing plate 100 to be perpendicular or close thereto to the cluster of solar trackers 10, the cluster of solar trackers 10 perpendicularly tilts the solar condensing plate 100 according to the first tilt control signal so as to prevent snow from piling up.

Also, when the snow cover amount information exceeds the snow cover amount threshold value, the control portion 204 may control such that a rotation control signal for allowing the solar condensing plate 100 to repetitively rotate at a certain angle away from a horizontal axis while the tilt of the solar condensing plate 100 is perpendicular or close thereto is transmitted to the cluster of solar trackers 10. Accordingly, when the server communication portion 200 transmits the rotation control signal, the cluster of solar trackers 10, which receives the rotation control signal, may repetitively rotate the tilt of the solar condensing plate 100 at the certain angle away from the horizontal axis by driving the tilt adjustment driving portion 122 according to the rotation control signal.

When the wind speed information is received from the wind speed sensor, the control portion 204 determines whether the received wind speed information exceeds a wind speed threshold value. When the wind speed information exceeds the wind speed threshold value, the control portion 204 controls such that a second tilt control signal of the solar condensing plate 100 with respect to the cluster of solar trackers 10 is transmitted to the cluster of solar trackers 10. Accordingly, when the server communication portion 200 transmits the second tilt control signal, the cluster of solar trackers 10, which receives the second tilt control signal, may adjust a tilt of the solar condensing plate 100 by driving the tilt adjustment driving portion 122. When the wind speed information exceeds the wind speed threshold value, the solar condensing plate 100 may be damaged by winds. To prevent this, when the control portion 204 transmits the second tilt control signal for allowing the tilt of the solar condensing plate 100 to be horizontal or close thereto to the cluster of solar trackers 10, the cluster of solar trackers 10 horizontally tilts the solar condensing plate 100 according to the second tilt control signal so as to minimize an influence of winds.

The control portion 204 may control operations of the cluster of solar trackers 10 depending on whether an operation mode of a particular solar tracker of the cluster of solar trackers 10 which is the westernmost one is a day mode or a night mode. For example, the control portion 204 determines whether the operation mode of the particular solar tracker of the cluster of solar trackers 10 which is the westernmost one is set to be a day mode or a night mode. When the operation mode of the particular solar tracker is set to be a day mode, the control portion 204 determines whether an azimuth of the particular solar tracker faces west using azimuth information detected by the azimuth sensor 106 of the particular solar tracker. To check an azimuth, the control portion 204 may transmit a request signal for azimuth information to the particular solar tracker and may receive the azimuth information in response thereto. When the azimuth of the particular solar tracker faces west, the control portion 204 determines whether insolation information detected by the illuminance sensor at a place where the particular solar tracker is located is less than a second insolation reference value. To check insolation, the control portion 204 may transmit a request signal for insolation information to the illuminance sensor at the place where the particular solar tracker or the cluster of solar trackers 10 is located and may receive the insolation information in response thereto. When the received insolation information is less than the second insolation reference value, the control portion 204 controls changing of settings to allow all the cluster of solar trackers 10 including the particular solar tracker to operate in a night mode. Here, the second insolation reference value refers to insolation which is a criterion for distinguishing a day time and a night time of one day from each other. Accordingly, it is defined as a day mode when the insolation information is at or above the second insolation reference value and is defined as a night mode when the insolation information is less than the second insolation reference value. For example, the second insolation reference value may be 10 Lux but is not limited thereto. When the server communication portion 200 transmits a mode change control signal of the control portion 204 to the cluster of solar trackers 10, the cluster of solar trackers 10 adjusts a direction of the solar condensing plate 100 to a night mode according to the received mode change control signal. In the night mode, as an example, an azimuth of the solar condensing plate 100 may face east and a tilt of the solar condensing plate 100 may be close to perpendicularity.

The output portion 206 may display state information of the cluster of solar trackers 10 through a display screen. Here, the state information with respect to the cluster of solar trackers 10 may be displayed with different colors.

Figure 4:
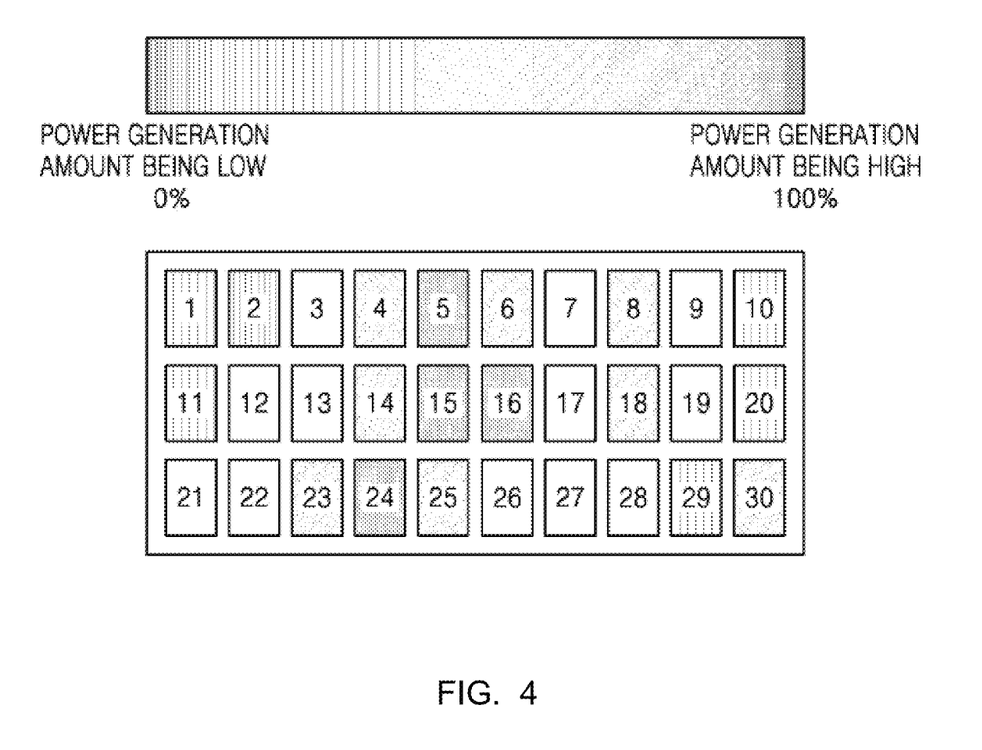
FIG. 4 is a reference view illustrating an example of state information of the cluster of solar trackers which are shown on a display screen of an output portion and have different patterns.

FIG. 4 is a reference view illustrating an example of state information of the cluster of solar trackers which are shown on the display screen of the output portion 206 and have different patterns. Referring to FIG. 4, as the state information with respect to the cluster of solar trackers 10, information on solar power generation amount or alarm information on whether it is abnormal may be displayed by using different patterns (for example, colors, brightness, shapes, and the like). For example, efficiency of the cluster of solar trackers 10 may be displayed using different colors according to power generation amount efficiency of each of the cluster of solar trackers. According to a color distribution chart, red color may refer to a maximum power generation amount and blue color may refer to a minimum power generation amount. Also, the output portion 206 may display state information of the cluster of solar trackers 10 with respect to whether the cluster of solar trackers 10 is normal, by using a differentiated pattern.

Figure 5:
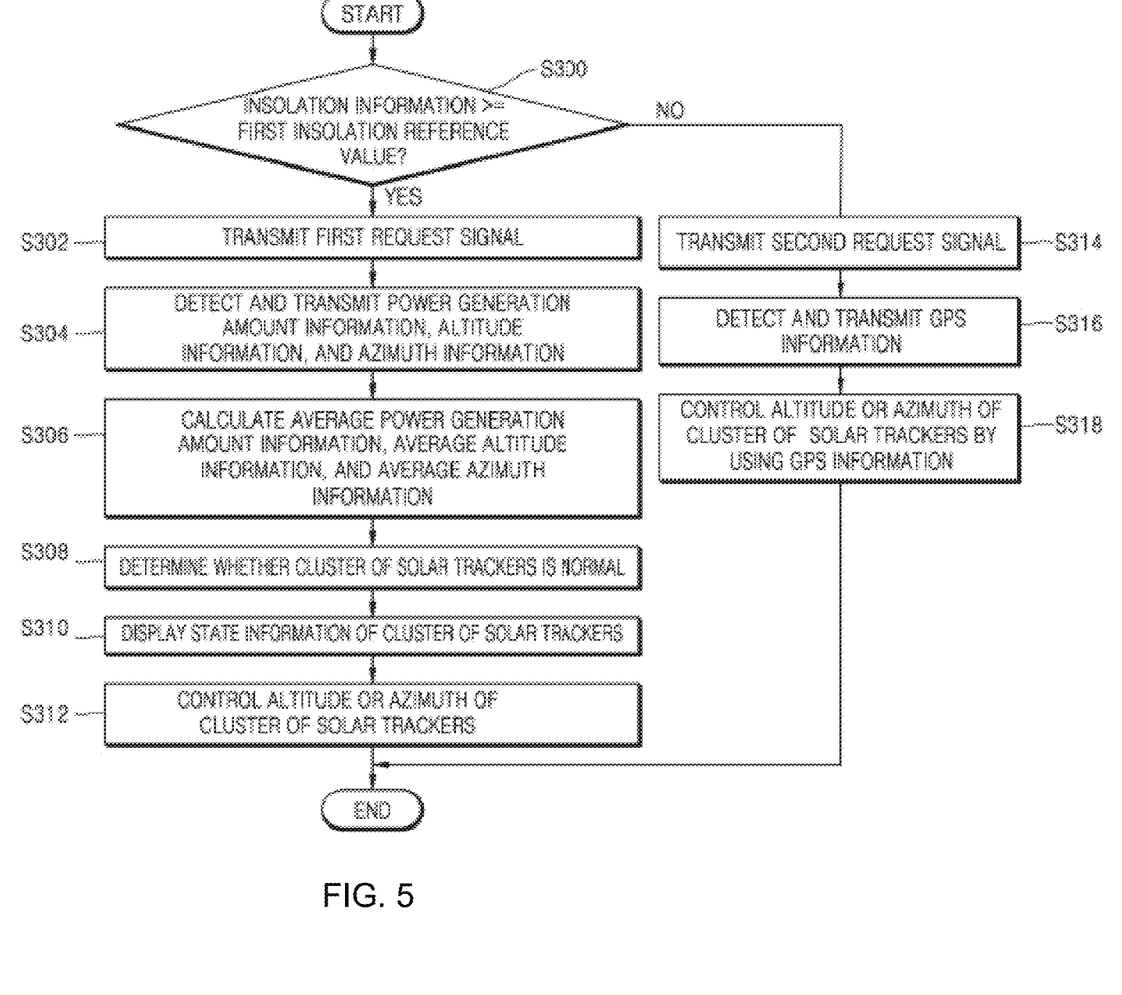
FIG. 5 is a flowchart illustrating an example of a method for controlling the cluster of solar trackers according to one embodiment of the present invention.

FIG. 5 is a flowchart illustrating an example of a method for controlling the cluster of solar trackers according to one embodiment of the present invention.

A server compares insolation information of a place where a cluster of solar trackers is located with a first insolation reference value (S300). To this end, the server request insolation information from an illuminance sensor, which exists at the place where the cluster of solar trackers, and receives and compares insolation information provided by the illuminance sensor with the first insolation reference value.

After operation S300, when the insolation information of the place where the cluster of solar trackers is located is at or above the first insolation reference value, the server transmits a first request signal for providing power generation amount information, altitude information, or azimuth information to each of the cluster of solar trackers (S302).

After operation S302, each of the cluster of solar trackers detects at least one of power generation amount information, altitude information, and azimuth information of its own and transmits the detected power generation amount information, altitude information, or azimuth information to the server (S304).

After S304, the server calculates average power generation amount information, average altitude information, or average azimuth information using the power generation amount information, altitude information, or azimuth information of each of the cluster of solar trackers (S306). The server adds the power generation amount information, altitude information, or azimuth information of each of the cluster of solar trackers and then divides a sum thereof by the number of corresponding cluster of solar trackers so as to calculate the average power generation amount information, average altitude information, or average azimuth information After operation S306, the server compares the calculated average power generation amount information, average altitude information, or average azimuth information with power generation amount information, altitude information, or azimuth information detected by each of the cluster of solar trackers so as to determine whether the cluster of solar trackers is normal (S308). For example, the server may compare the power generation amount information detected by each of the cluster of solar trackers with the calculated average power generation amount information and may determine, according to a result of comparison, that one of the cluster of solar trackers which deviates from a threshold range of the average power generation amount information does not normally operate. Also, the control portion 204 may compare the altitude information detected by each of the cluster of solar trackers 10 with the calculated average altitude information and may determine, according to a result of comparison, that one of the cluster of solar trackers which deviates from a threshold range in comparison to the average altitude information does not normally operate. Also, the server may compare the azimuth information detected by each of the cluster of solar trackers with the calculated average azimuth information and may determine, according to a result of comparison, that one of the cluster of solar trackers which deviates from a threshold range in comparison to the average azimuth information does not normally operate.

After operation S308, the server displays state information of the cluster of solar trackers on a display screen (S310). The server may calculate power generation amount efficiency of each of the cluster of solar trackers by comparing power generation amount information of each of the cluster of solar trackers with maximum power generation amount information of the cluster of solar trackers. Accordingly, the server may display efficiency of each of the cluster of solar trackers by using a different color according to the calculated power generation amount efficiency. Also, the server may display the state information on whether the cluster of solar trackers is normal using a different color.

After operation S310, the server controls an altitude and an azimuth of each of the cluster of solar trackers according to the state information of the cluster of solar trackers (S312). When it is determined that abnormal one of the cluster of solar trackers is present, the server may control an altitude and an azimuth of the abnormal one of the cluster of solar trackers on the basis of the average altitude information and the average azimuth information. When the server transmits a control signal for adjusting an altitude or azimuth to the solar trackers, the solar trackers, which receive the control signal, may adjust altitudes or azimuths thereof by driving an altitude adjustment driving portion or an azimuth adjustment driving portion according to the control signal.

Meanwhile, in operation S300, when the insolation information of the place where the cluster of solar trackers is located is less than the first insolation reference value, the server transmits a second request signal for providing GPS information with respect to each of the cluster of solar trackers to each of the cluster of solar trackers (S314). When the insolation information of the place where the cluster of solar trackers is located is less than the first insolation reference value, it corresponds to a cloudy weather. Accordingly, in the cloudy weather, the server requests GPS information, which is relatively accurate regardless of a weather, among pieces of information detected by the cluster of solar trackers.

After operation S314, each of the cluster of solar trackers detects GPS information thereof and transmits the detected GPS information to the server (S316).

After operation S316, the server controls the altitude and azimuth of each of the cluster of solar trackers according to the GPS information of the cluster of solar trackers (S318). The server detects altitude information or azimuth information from the GPS information transmitted from each of the cluster of solar trackers and transmits a control signal corresponding to the detected altitude information or azimuth information to each of the cluster of solar trackers. Accordingly, the cluster of solar trackers, which receives the control signal, may adjust the altitude or azimuth by driving the altitude adjustment driving portion or the azimuth adjustment driving portion according to the control signal.

The exemplary embodiments of the present invention have been described above. One of ordinary skill in the art may understand that modifications may be made without departing from the scope of the present invention. Therefore, the disclosed embodiments should be considered in a descriptive point of view not limitative one. Accordingly, the scope of the present invention is not limited to the above-described embodiments and should be understood as including the content stated in the claims and a variety of embodiments within the equivalent scope thereof.

What is claimed is:

1. A method of controlling a cluster of solar trackers in which a plurality of solar trackers exist as a cluster shape, the method comprising:
   detecting, by each of the cluster of solar trackers, one or more of power generation amount information, altitude information, and azimuth information thereof and transmitting the detected power generation amount information, altitude information, or azimuth information to a server;
   calculating, by the server, average power generation amount information, average altitude information, or average azimuth information using the power generation amount information, altitude information, or azimuth information of each of the cluster of solar trackers; and
   determining whether the cluster of solar trackers is normal by comparing the calculated average power generation amount information, average altitude information, or average azimuth information with the power generation amount information, altitude information, or azimuth information detected by each of the cluster of solar trackers.

2. The method of claim 1, further comprising:
   comparing, by the server, insolation information of a place where the cluster of solar trackers is located with an insolation reference value; and
   transmitting, by the server, a first request signal for providing the power generation amount information, altitude information, or azimuth information to each of the cluster of solar trackers when the insolation information of the place where the cluster of solar trackers is located is at or above the insolation reference value,
   wherein, in response to the first request signal, the cluster of solar trackers detects and transmits the power generation amount information, altitude information, or azimuth information to the server.

3. The method of claim 2, further comprising:
   transmitting, by the server, a second request signal for providing global positioning system (GPS) information with respect to each of the cluster of solar trackers to each of the cluster of solar trackers when the insolation information of the place where the cluster of solar trackers is located is less than the insolation reference value;
   detecting, by each of the cluster of solar trackers, the GPS information thereof and transmitting the detected GPS information to the server; and
   controlling, by the server, an altitude and an azimuth of each of the cluster of solar trackers by using the GPS information of each of the cluster of solar trackers.

4. The method of claim 1, further comprising:
   displaying, by the server, state information of the cluster of solar trackers on a display screen; and
   controlling, by the server, an altitude or an azimuth of each of the cluster of solar trackers according to the state information of the cluster of solar trackers.

5. A system for controlling a cluster of solar trackers, comprising:
   a cluster of solar trackers which detects one or more of power generation amount information, altitude information, and azimuth information thereof; and
   a server which determines whether the cluster of solar trackers is normal by using the power generation amount information, altitude information, or azimuth information provided by the cluster of solar trackers,
   wherein the server determines whether the cluster of solar trackers is normal by calculating average power generation amount information, average altitude information, or average azimuth information by using the power generation amount information, altitude information, or azimuth information of each of the cluster of solar trackers and comparing the calculated average power generation amount information, average altitude information, or average azimuth information with the power generation amount information, altitude information, or azimuth information detected by the cluster of solar trackers.

6. The system of claim 5, further comprising an illuminance sensor which detects insolation information of a place where the cluster of solar trackers is located,
   wherein when the illuminance sensor transmits the insolation information to the server, the server determines whether the received insolation information is at or above an insolation reference value and transmits a first request signal for providing the power generation amount information, altitude information, or azimuth information to each of the cluster of solar trackers when the insolation information of the place where the cluster of solar trackers is located is at or above the insolation reference value.

7. The system of claim 6, wherein when the insolation information of the place where the cluster of solar trackers is located is less than the insolation reference value, the server transmits a second request signal for providing GPS information with respect to each of the cluster of solar trackers to each of the cluster of solar trackers,
   wherein each of the cluster of solar trackers detects the GPS information thereof and transmits the detected GPS information to the server, and wherein the server controls an altitude and an azimuth of each of the cluster of solar trackers by using the GPS information of each of the cluster of solar trackers.

8. The system of claim 6, wherein the server displays state information of the cluster of solar trackers on a display screen.

* * * * *